(12) United States Patent
Kok et al.

(10) Patent No.: US 7,414,562 B2
(45) Date of Patent: Aug. 19, 2008

(54) ANALOG-TO-DIGITAL CONVERSION USING ASYNCHRONOUS CURRENT-MODE CYCLIC COMPARISON

(75) Inventors: Chi Wah Kok, Hong Kong (CN); Wing Shan Tam, Hong Kong (CN)

(73) Assignee: Intellectual Ventures Fund 27 LLC, Las Vegas, NV (US)

( * ) Notice: Subject to any disclaimer, the term of this patent is extended or adjusted under 35 U.S.C. 154(b) by 0 days.

(21) Appl. No.: 11/492,245

(22) Filed: Jul. 25, 2006

(65) Prior Publication Data
US 2008/0024346 A1   Jan. 31, 2008

(51) Int. Cl.
*H03M 1/12* (2006.01)
(52) U.S. Cl. .................. 341/155; 341/161; 341/163
(58) Field of Classification Search ............ 341/155, 341/161, 163, 135, 141, 162
See application file for complete search history.

(56) References Cited

U.S. PATENT DOCUMENTS

| | | | |
|---|---|---|---|
| 4,275,386 A * | 6/1981 | Michel et al. ............... 341/159 |
| 4,667,180 A | 5/1987 | Robinson .................... 341/161 |
| 6,150,967 A * | 11/2000 | Nakamura .................. 341/135 |
| 6,504,500 B1 | 1/2003 | Tsukamoto .................. 341/155 |
| 6,768,282 B2 * | 7/2004 | Lutter et al. ................. 318/603 |
| 6,891,495 B2 * | 5/2005 | Chen et al. .................. 341/161 |
| 6,940,444 B1 | 9/2005 | Arigliano .................... 341/161 |
| 7,002,505 B2 * | 2/2006 | Hughes ....................... 341/161 |
| 7,187,316 B1 * | 3/2007 | DeGeronimo ............... 341/155 |

* cited by examiner

*Primary Examiner*—Peguy JeanPierre
(74) *Attorney, Agent, or Firm*—Schwabe, Williamson & Wyatt, P.C.

(57) ABSTRACT

An asynchronous cyclic current-mode analog-to-digital converter (ADC) is disclosed. The ADC comprises a plurality of sub-ADCs cascading from the first stage to the last stage, each sub-ADC comprising a current-mode ADC having a digital output, an analog current input, a reference current input and an analog current output. The analog current input of each stage, except the first stage, is operatively connected to the analog current output of the immediately preceding stage. The plurality of sub-ADCs are configured to operate without synchronization with each other.

16 Claims, 10 Drawing Sheets

ANALOG-TO-DIGITAL CONVERSION USING ASYNCHRONOUS CURRENT-MODE CYCLIC COMPARISON

BACKGROUND

The invention relates to an analog-to-digital converters (ADCs), and in particular, to a series-connected A/D converter, such as an asynchronous A/D converter, a successive-approximation A/D converter and a cyclic comparison A/D converter as presented in this invention.

Analog-to-digital conversion is a vital device for a lot of applications, because most signals are analog in nature and have to be digitized for interpretation and digital signal processing. Traditionally, analog-to-digital converters (ADCs) are applied to digitize the signal, where the ADC is required to possess the characteristic of having a high resolution, wide dynamic range, high conversion speed, and low power consumption.

Flash ADCs perform well in term of conversion speed, because all bits of the digital word are determined simultaneously. However, flash ADCs are usually constructed to have a short conversion word length (usually less than 8 bits), and thus poor resolution, because high resolution flash ADCs occupy a large silicon area, which makes them less favorable in high resolution application.

Successive-approximation ADCs are frequently used in medium-to-high-resolution applications, where the conversion word lengths are usually in the range of 8 to 16 bits. This is because successive-approximation ADCs can achieve reasonable conversion rate with low power consumption.

Successive-approximation ADC samples an analog input and compares it to the output of a digital-to-analog converter (DAC), where the output of the DAC is sequentially determined by a series of comparison between the input to a number of references until the difference between the DAC output and analog input is smaller than the conversion resolution. Successive-approximation ADCs systematically evaluate the analog input signal in N steps to produce an N-bit digital word. The determination of the digital word begins with the most significant bit (MSB) and progressively to the least significant bit (LSB).

One of the disadvantages of successive-approximation ADCs is that each bit must be determined sequentially and in synchronization with the clock signal. As a result, O(N) clocks cycles (i.e., number of clock cycles is with the order of N) are required to convert an analog signal to a N-bit digital signal, where only O(1) clock cycle is required in flash ADC. Therefore, successive-approximation ADCs are inferior to flash ADCs in the sense of conversion speed due to the above adverse effect.

Multistage pipelined architectures divide the single analog-to-digital converter into two or more stages, in which all stages are operated concurrently and hence increase the throughput rate. A multistage pipelined ADC consists of two or more stages with the first stage that determines the most significant m bits and with the remaining N-m bits determined by the later stage(s). The first stage always works on the most recent sample, while the later stage(s) operate(s) on pass samples. Sample and hold circuits between individual stages allow the ADC to handle more than one samples at one time and thus the throughput rate increases.

Multistage pipelined ADCs consume less power and occupy less silicon area when compared to that of flash ADCs, because fewer comparators are required in pipelined converters than that of flash ADCs to obtain same resolution. However, multistage pipelined ADCs suffer from multistage gain error which arises from the non-ideal gain amplifiers between different stages.

Cyclic comparison ADC performs N-bit conversion through N stages. One of the bits in the length-N digital word is determined in each stage. FIG. 1 shows a block diagram of a prior art bit cell 100. Each bit cell corresponds to a single bit analog-to-digital conversion. The bit cell 100 includes a sample-and-hold (S/H) circuit 101, a single-bit ADC 102, a single-bit digital-to-analog converter (DAC) 103, a voltage subtractor 104, and an amplifier 105. The S/H circuit 101 samples an analog input signal IN. Then, the S/H circuit 101 provides the held analog signal $V_{IN}$ to the ADC 102 and the voltage subtractor 104. The ADC 102 receives a median voltage $V_{REF}$ of the dynamic range of the conversion, which is compared with the analog signal $V_{IN}$ to generate a single-bit digital signal DOUT. Then, the digital signal DOUT is passed to the single-bit DAC 103. The single-bit DAC 103 generates an analog signal V1 according to the digital output DOUT. V1 is then passed to the voltage subtractor 104. The voltage subtractor 104 subtracts the analog signal V1 from the analog input signal $V_{IN}$ and provides the amplifier 105 with the difference signal (i.e. $V_{IN}$–V1). The amplifier 105 which has a gain of two that doubles the amplitude of the difference signal (VN–V1) to generate the analog output voltage OUT. The analog output voltage OUT is then passed to subsequent stage for conversion.

FIG. 2 shows a diagram illustrating an algorithm performed by the bit cell 100, and FIG. 3 shows a diagram illustrating the operation of the bit cell 100. The analog input signal $V_{IN}$ sourced externally or from previous bit cell is compared with the median voltage $V_{REF}$ of the conversion range (step 201) to generate a single-bit digital signal DOUT, where a "0" means $V_{IN}$<$V_{REF}$ and a "1" means $V_{IN}$ Error! Objects cannot be created from editing field codes. $V_{REF}$. The digital signal DOUT undergoes a mathematical operation of Error! Objects cannot be created from editing field codes. or Error! Objects cannot be created from editing field codes. (steps 202, 203). The operation result is transferred to next bit cell.

Cyclic comparison ADCs can be implemented with simple circuitry when compared to that of conventional successive-approximation ADCs, because identical reference is used in all stages. The simplification of circuitry reduces the requirements on power consumption and silicon area. Voltage-mode cyclic comparison ADCs are usually realized in switched-capacitor (SC) techniques, for which synchronization is critical. The time for N-bit conversion of voltage-mode cyclic comparison ADCs is limited to O(N) of clock cycles. However, the linearity of the SC cyclic comparison ADC depends on the linearity of capacitor and the accuracy in capacitor matching. The SC cyclic comparison ADCs also suffer from the adverse effects of common SC circuit, such as charge sharing, charge leakage, e.t.c. Despite the silicon area is reduced with circuitry simplification, the overall silicon area reduction is still limited by the capacitors.

SUMMARY

In one aspect of the invention, an asynchronous current-mode cyclic comparison ADC circuit is disclosed. The present application describes in various embodiments of asynchronous current-mode cyclic comparison ADCs comprising a bit cell for converting an input current $I_{IN}$ to a single-bit digital signal (a current-mode one-bit ADC). A plurality of bit cells can be connected in cascade manner and operate asynchronously to generate a multi-bit digital representation of an analog current input.

BRIEF DESCRIPTION OF THE DRAWINGS

The invention, together with objectives and advantages thereof, may best be understood by reference to the following description of the presently preferred embodiments together with the accompanying drawings in which.

DESCRIPTION OF THE ILLUSTRATIVE EMBODIMENTS

The illustrative embodiments of the invention include a novel asynchronous current-mode cyclic comparison analog-to-digital converter.

Analog-to-digital converters (ADCs) are commonly synchronized with a system clock. Converters with a fixed conversion time are subject to errors due to metastability. These errors will occur in all converter designs with a fixed time for decisions, and are potentially severe. The advantage of asynchronous ADCs is that problems linked to increasing clock frequencies such as complications regarding the clock effects on EMI, power dissipation, and average-case performance, can be avoided.

Figure 1:
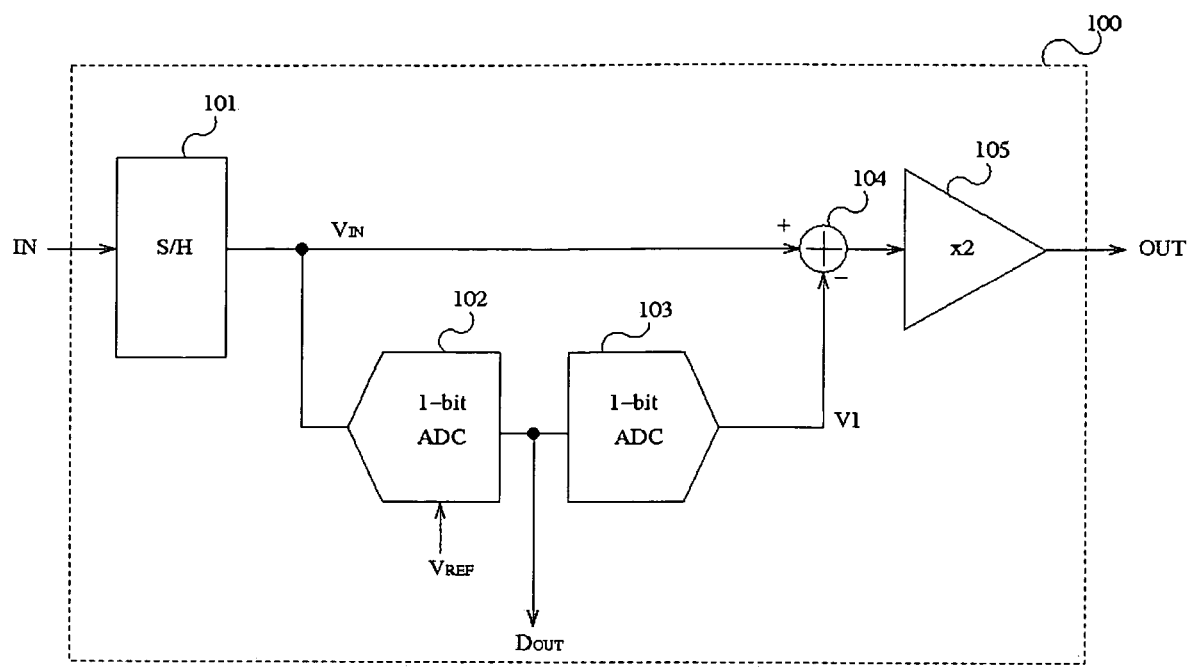
FIG. 1 shows a block diagram of a prior art bit cell.
Figure 2:
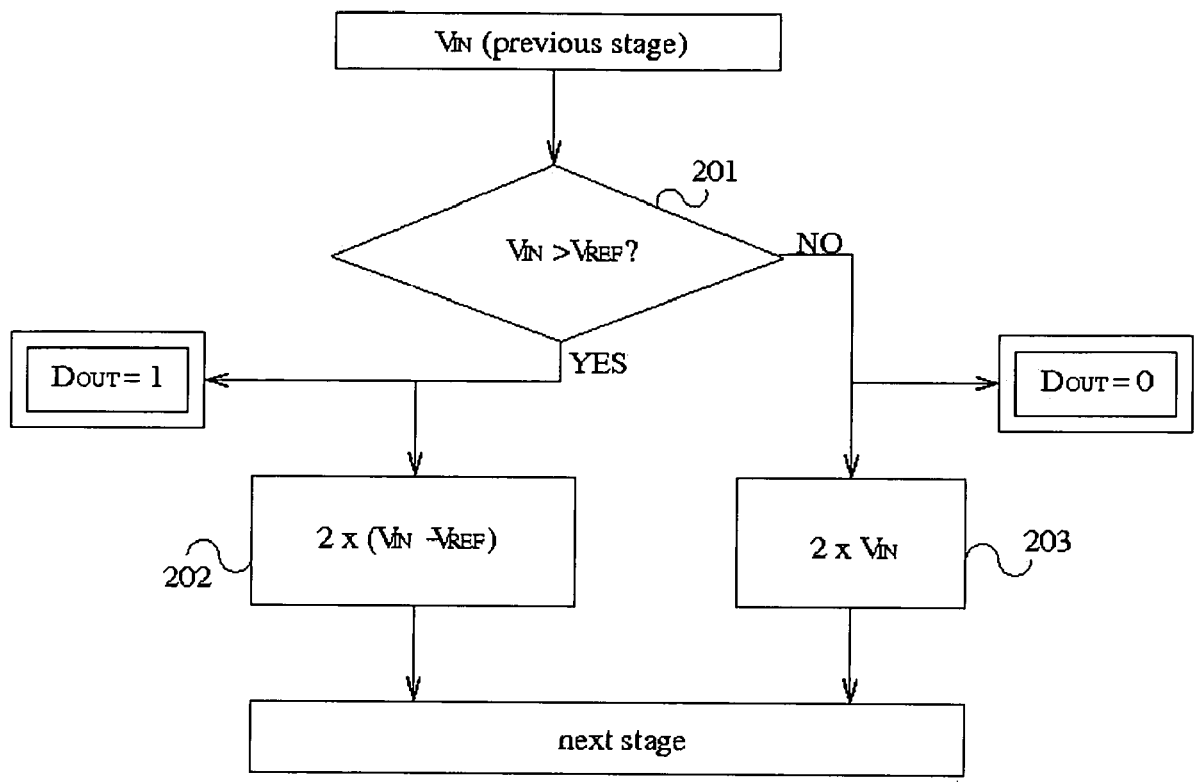
FIG. 2 shows an explanatory diagram illustrating the algorithm performed by the prior art ADC.
Figure 3:
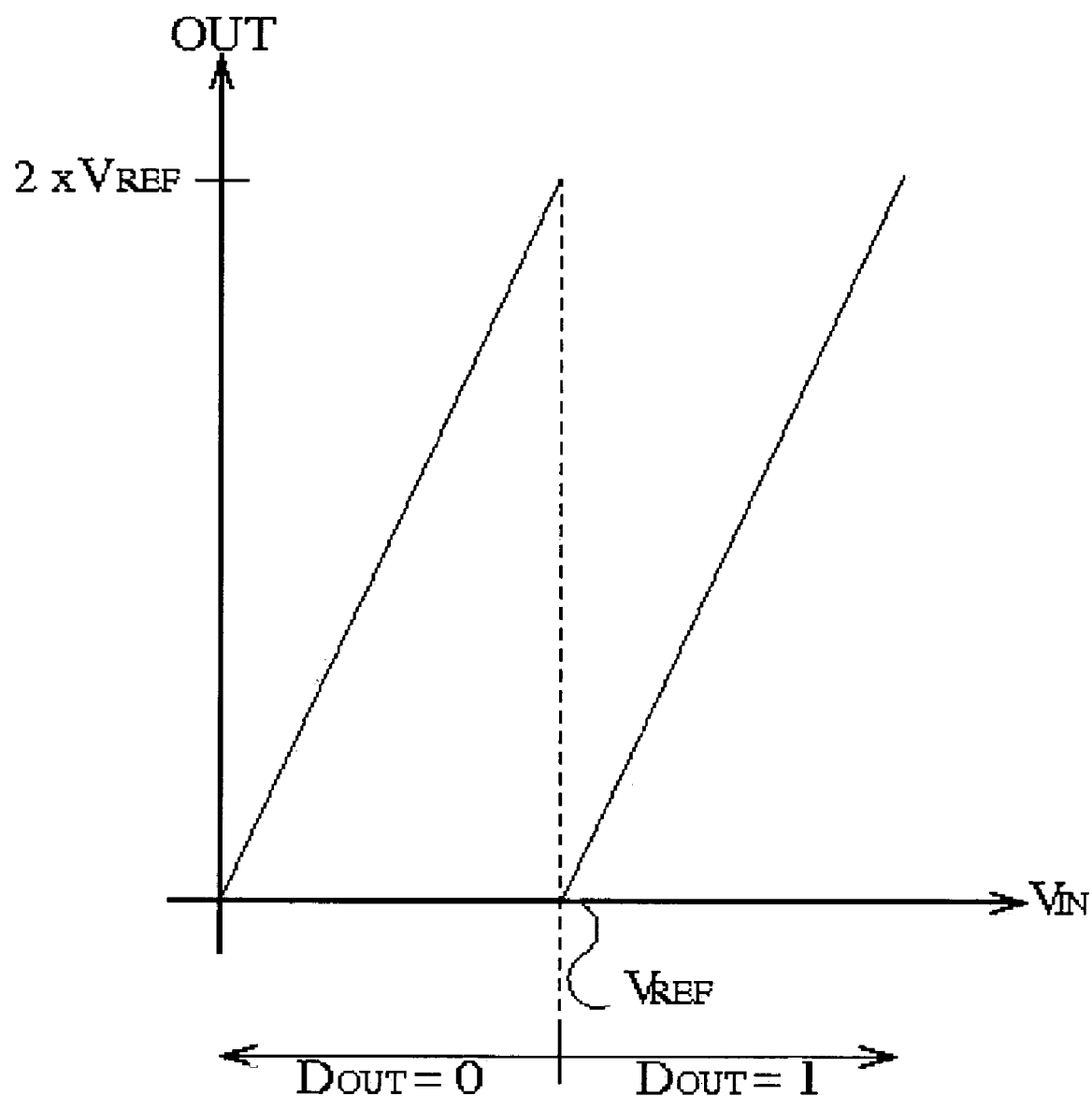
FIG. 3 shows a diagram illustrating the operation of the prior art bit cell.
Figure 4:
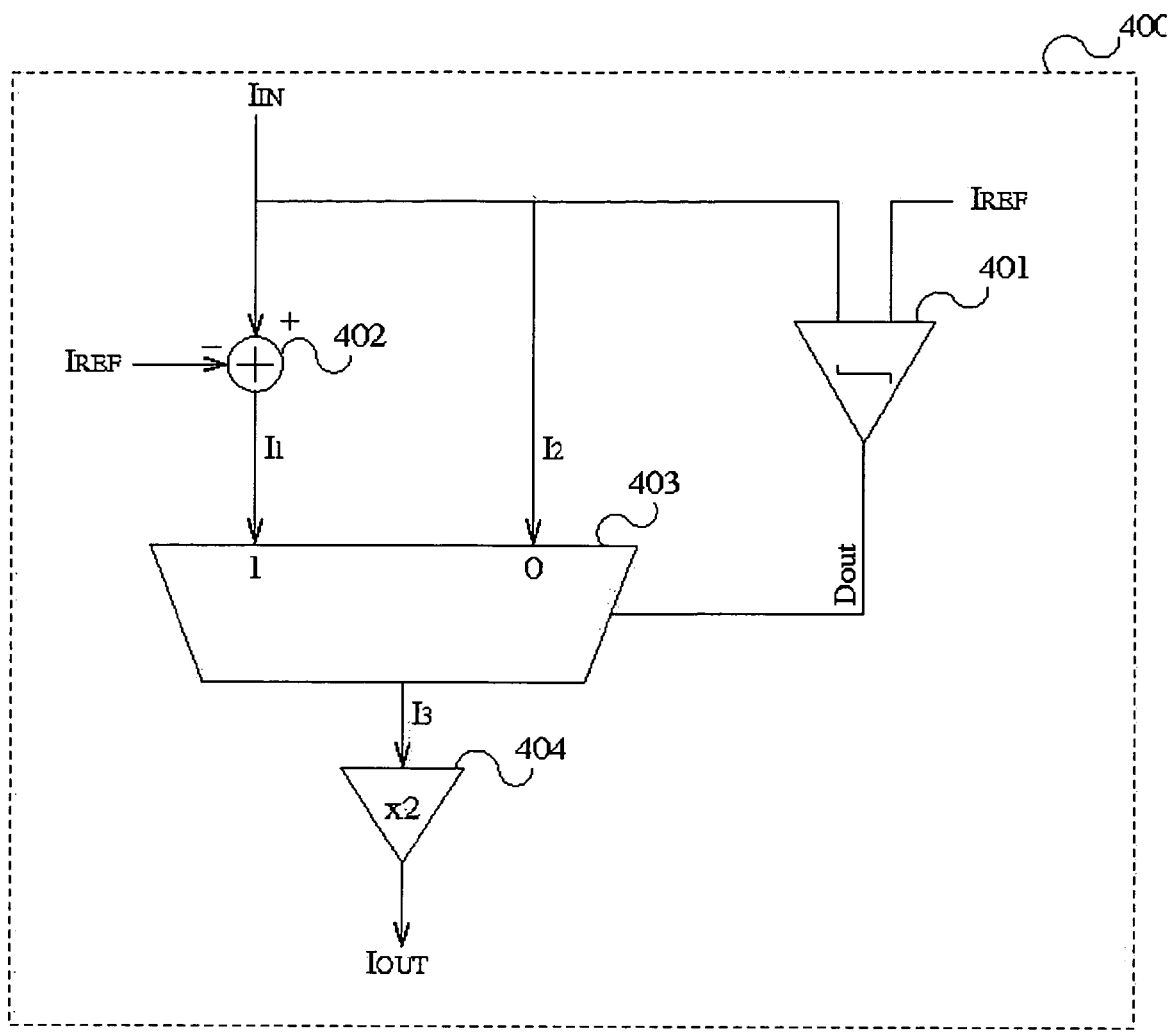
FIG. 4 shows a block diagram of a bit cell of an asynchronous current-mode cyclic comparison ADC according to an aspect of the invention.

FIG. 4 shows the block diagram of the bit cell. The bit cell 400 performs a mathematical operation that compares the input current $I_{IN}$ with the reference current $I_{REF}$ by a current comparator 401. There are 2 input terminals and 2 output terminals of the bit cell 400. The first input terminal is for the analog input signal $I_{IN}$. The second input terminal is for the reference signal $I_{REF}$. The first output terminal is for the 1-bit digital output of the analog-to-digital conversion result DOUT. The second output terminal is for the analog output current $I_{OUT}$, which is the analog signal passed to subsequent bit cell. The output of the bit cell is converted digit DOUT, which equals to the output of the current comparator 401, where a "0" means the amplitude of the input current $I_{IN}$ is lower than that of $I_{REF}$ and "1" means the amplitude of the input current $I_{IN}$ is greater than or equals to that of $I_{REF}$. Depending on DOUT, an output current $I_{OUT}$ is generated at the output of the bit cell, which equals to $I_{OUT}=2\times(I_{IN}-I_{REF})$ when DOUT="1" or $I_{OUT}=2\times I_{IN}$ when DOUT="0". The current comparator output controls an analog multiplexer 403 to pass the corresponding $I_{OUT}$, which will subsequently input to the bit cell in following stages for conversion to obtain other conversion digits. Current $I_1$ and $I_2$ are the inputs of an analog multiplexer 403, where the output of the multiplexer 403 is controlled by DOUT. When $I_{IN}$ Error! Objects cannot be created from editing field codes. $I_{REF}$, DOUT="1", the output of the analog multiplexer 403 is $I_3=I_1$, otherwise $I_3=I_2$. The current multiplication circuit 404 doubles the output current of the analog multiplexer 403 $I_3$, hence the output of the bit cell is $I_{out}=2\times I_3$. Due to the selection operation of the analog multiplexer 403, the inputs to bit cells in all stages are bounded by $2\times I_{REF}$. Moreover, the reference current $I_{REF}$ applied on each bit cell is fixed to be the same. The requirement on multi-threshold process can be avoided, and hence can achieve higher conversion accuracy with less process variation problem.

Figure 7:
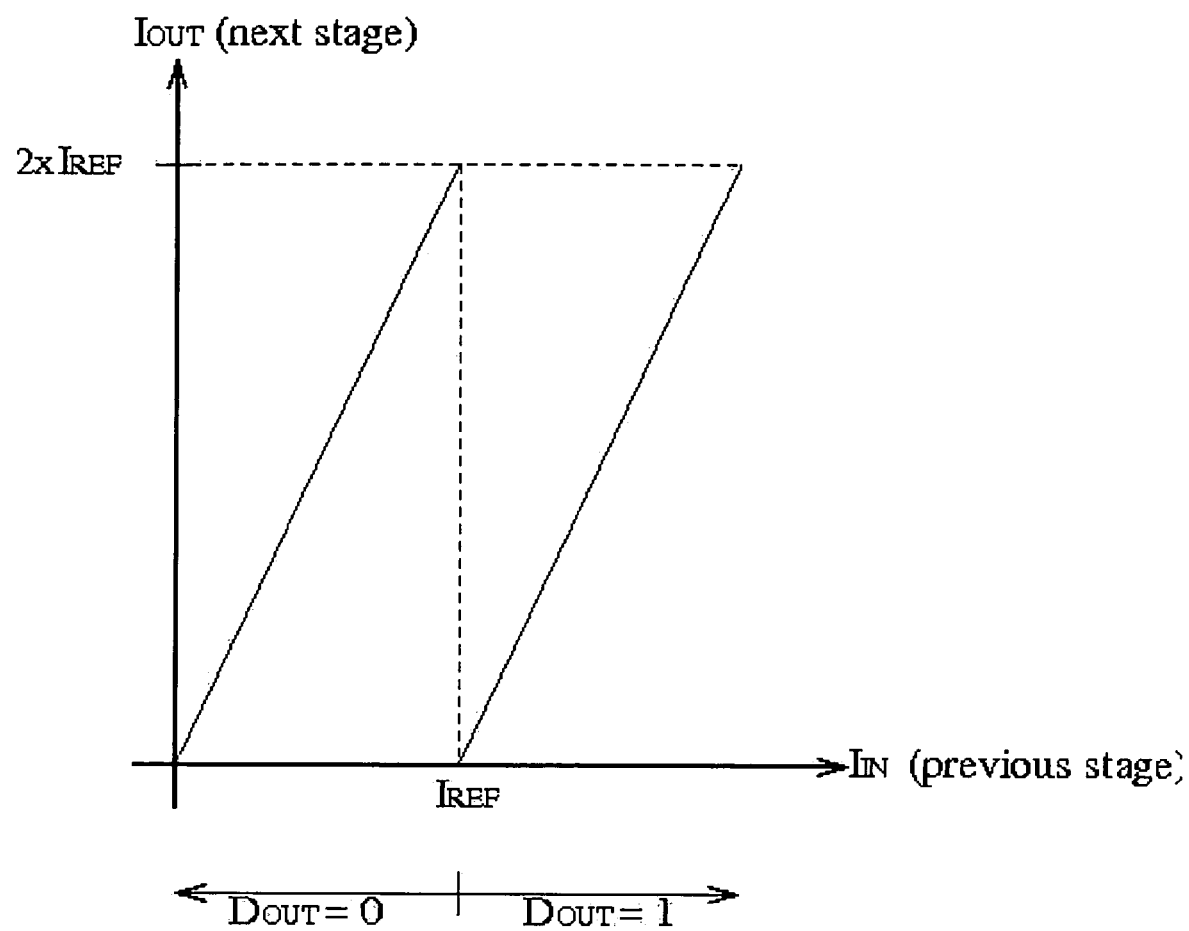
FIG. 7 shows a diagram illustrating the operation of the bit cell of FIG. 4.

FIG. 7 illustrates the operation of the bit cell 400. If the amplitude of the analog input signal $I_{IN}$ is smaller than that of the reference signal $I_{REF}$, the amplitude of the original analog input signal $I_{IN}$ is doubled. If the amplitude of the analog input signal $I_{IN}$ is larger than that of the reference signal $I_{REF}$, the analog input signal $I_{IN}$ is first subtracted by the reference signal $I_{REF}$, then the difference signal $I_{IN}-I_{REF}$ is doubled in amplitude. Thereafter, the analog output signal $I_{OUT}$ of bit cell 400 as shown in FIG. 4 is obtained. The analog output signal $I_{OUT}$ of bit cell 400 is then passed to the subsequent bit cell. The analog input signal $I_{IN}$ of subsequent stage equals to $2\times I_{IN}$ when previous stage DOUT="0" and $I_{IN}$ of subsequent stage equals to $2\times(I_{IN}-I_{REF})$ when previous stage DOUT="1". Thus, the amplitude of $I_{OUT}$ is bounded between 0 to $2\times I_{REF}$. The reference signal $I_{REF}$ for each bit cell in an N-bit asynchronous current-mode cyclic comparison converter is identical and thus avoid the need of multi-threshold process. The reference signal $I_{REF}$ is the median current level of the dynamic range of conversion, i.e., the range of the amplitude of the input current that can be represented by the digital output of the ADC to the resolution of the ADC. Therefore, the conversion dynamic range of the illustrative embodiment of the invention is scalable by adjusting the level of the reference signal $I_{REF}$. The dynamic range of the circuit in the illustrative embodiment is from 0 to 2×Iref (i.e., the bits of the digital output of the ADC all become "1" when the analog input current reaches 2×Iref).

Figure 6:
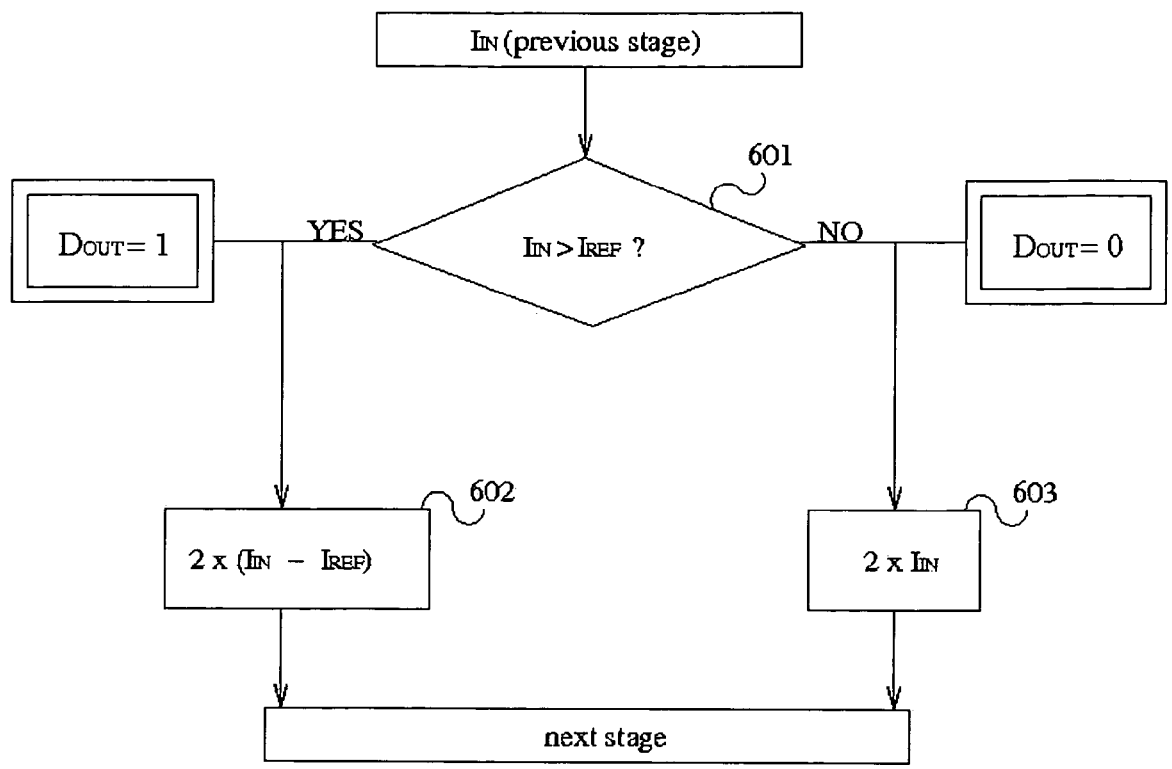
FIG. 6 shows an explanatory diagram illustrating the algorithm performed by the asynchronous current-mode cyclic ADC according to an aspect of the invention.

FIG. 6 shows the explanatory diagram illustrating the algorithm performed by the asynchronous current-mode cyclic comparison ADC. The analog input signal $I_{IN}$ is sourced externally or from previous bit cell. The analog input signal $I_{IN}$ is then compared to the reference signal $I_{REF}$ by the current comparator 401 (step 601). When $I_{IN}$ Error! Objects cannot be created from editing field codes. $I_{REF}$, the current comparator 401 produces a digital signal DOUT="1". When $I_{IN}<I_{REF}$, the current comparator 401 produces a digital signal DOUT="0". The digital signal DOUT controls the analog multiplexer 403. The analog input signal $I_{IN}$ or the current output from the current subtraction circuit 402 is passed through the analog multiplexer 403 to the current multiplication circuit 404 according to the current comparator 401 output DOUT. When DOUT="1", the original analog input signal $I_{IN}$ is passed through the analog multiplexer 403. When DOUT="0", the current subtraction circuit 402 output (i.e. $I_{IN}-I_{REF}$) is passed through the analog multiplexer 403. The current multiplication circuit 404 doubles the amplitude of the current output from the analog multiplexer 403. Thus, the analog output signal $I_{OUT}$ is set according to the value of DOUT. When DOUT="1", $I_{OUT}$ is set as $2\times(I_{IN}-I_{REF})$, where $I_{IN}-I_{REF}$ is obtained from the current subtraction circuit 402 (step 602). When DOUT="0", $I_{OUT}$ is set as $2\times I_{IN}$ (step 603). The current subtraction circuit 402 and current multiplication circuit 404 can be constructed by using current mirror circuits, which can enhance the flexibility to adjust the dynamic range of the bit cell and hence the ADC. The accuracy of the current subtraction circuit 402 and current multiplication circuit 404 depends on the linearity of current mirrors. Current subtraction and current multiplication operations implemented using current mirrors promote an opamp free design which enhances the system power efficiency and reduces the demand on silicon area.

In accordance with another aspect of the invention an asynchronous current-mode cyclic comparison ADC circuit is disclosed, wherein scalable dynamic range of conversion can be achieved. The dynamic range is defined from 0 to $2\times I_{REF}$, where $I_{REF}$ is the reference signal. The dynamic range can be adjusted by varying the amplitude of $I_{REF}$. The current subtraction circuit 402 and current multiplication circuit 403 can be implemented by using current mirrors, which can enhance the power efficiency of the invention. However, the upper bound of the dynamic ranges of the current subtraction circuit and multiplication circuit are limited by the linearity of the current mirrors since current mirror linearity varies across different current level. Therefore, the flexibility to adjust the dynamic range in this embodiment depends on the linearity of the current mirrors used in the subtraction circuit 402 and multiplication circuit 403.

Figure 5:
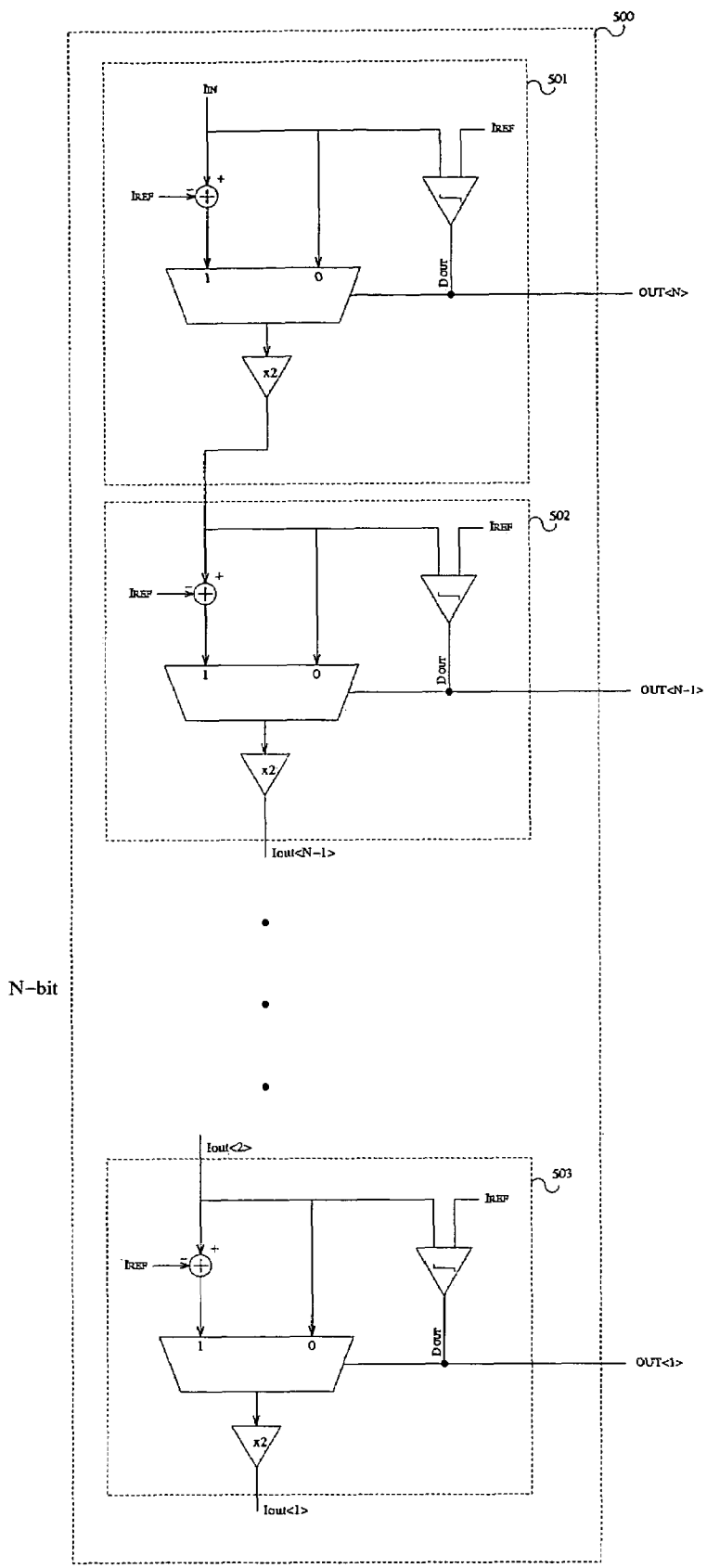
FIG. 5 shows a block diagram of the asynchronous current-mode cyclic comparison ADC according to an aspect of the invention.

FIG. 5 shows a block diagram of an N-bit asynchronous current-mode cyclic comparison ADC according to a preferred embodiment of the invention. The ADC 500 converts an analog input signal $I_{IN}$ to a N-bit digital signal OUT<N:1>. The N-bit asynchronous current-mode cyclic comparison ADC 500 consists of N asynchronous current-mode cyclic comparison ADC bit cells 400 as shown in FIG. 4. The number of bit cells N can be varied and it is corresponding to the number of bits of the required digital output. Bit cell 501 corresponds to the most significant bit (MSB) conversion of the analog input signal $I_{IN}$. Bit cell 502 corresponds to the second most significant bit conversion of the analog input signal $I_{IN}$. Bit cell 503 corresponds to the least significant bit (LSB) conversion of the analog input signal $I_{IN}$. The first input terminal of bit cell 501 is coupled to the external analog input signal $I_{IN}$. The second input terminal of bit cell 501 is coupled to the reference signal $I_{REF}$. The first output terminal of bit cell 501 is coupled to the first input terminal of bit cell 502. The second output terminal of bit cell 502 is coupled to the first input terminal of the subsequent bit cell. The rest of the (N–3) bit cells are connected in cascading manner with the first output terminal of each bit cell coupled to the first input terminal of the subsequent bit cell and second input terminals of each bit cells coupled to the reference signal $I_{REF}$. Analog-to-digital conversion starts at the MSB bit cell 501. The analog input current IN sourced will undergo MSB conversion by bit cell 501. The analog input current $I_{IN}$ is compared to the reference signal $I_{REF}$ by the current comparator in bit cell 501 and generates conversion output DOUT. When $I_{IN}$ Error! Objects cannot be created from editing field codes. $I_{REF}$, DOUT="1" and $I_{OUT}=2\times(I_{IN}-I_{REF})$. When $I_{IN}<I_{REF}$, DOUT="0" and $I_{OUT}=2\times I_{IN}$. Hence, MSB is determined. The analog output signal $I_{OUT}$ is passed to the subsequent bit cell 502 for the second MSB conversion. Each bit cell undergoes the same operations performed by bit cell 501. N-bit conversion is completed when bit cell 503 digital output DOUT (i.e. the LSB of length-N digital word) is ready.

In accordance with another aspect of the invention an asynchronous current-mode cyclic comparison ADC circuit is disclosed, wherein the digital output of an N-bit word can be generated without the need of clock synchronization. The N-bit asynchronous current-mode cyclic comparison ADC shown in FIG. 5 can be used to achieve such N-bit digital word conversion. Asynchronous operation can also be achieved simultaneously because it uses current steering techniques rather than switched capacitor technique. All bit cells is self-calibrated and operated sequentially without the need of clock synchronization.

In accordance with another aspect of the invention an asynchronous current-mode cyclic comparison ADC circuit is disclosed, where the conversion accuracy is consistent across all digits. In FIG. 5, each bit cell 400 acts as a 1-bit current mode ADC that corresponds to the conversion of one bit of the length-N digital word. Identical current comparator 401 is used for every single bit of conversion and hence consistent conversion accuracy across all digits can be achieved.

Figure 9:
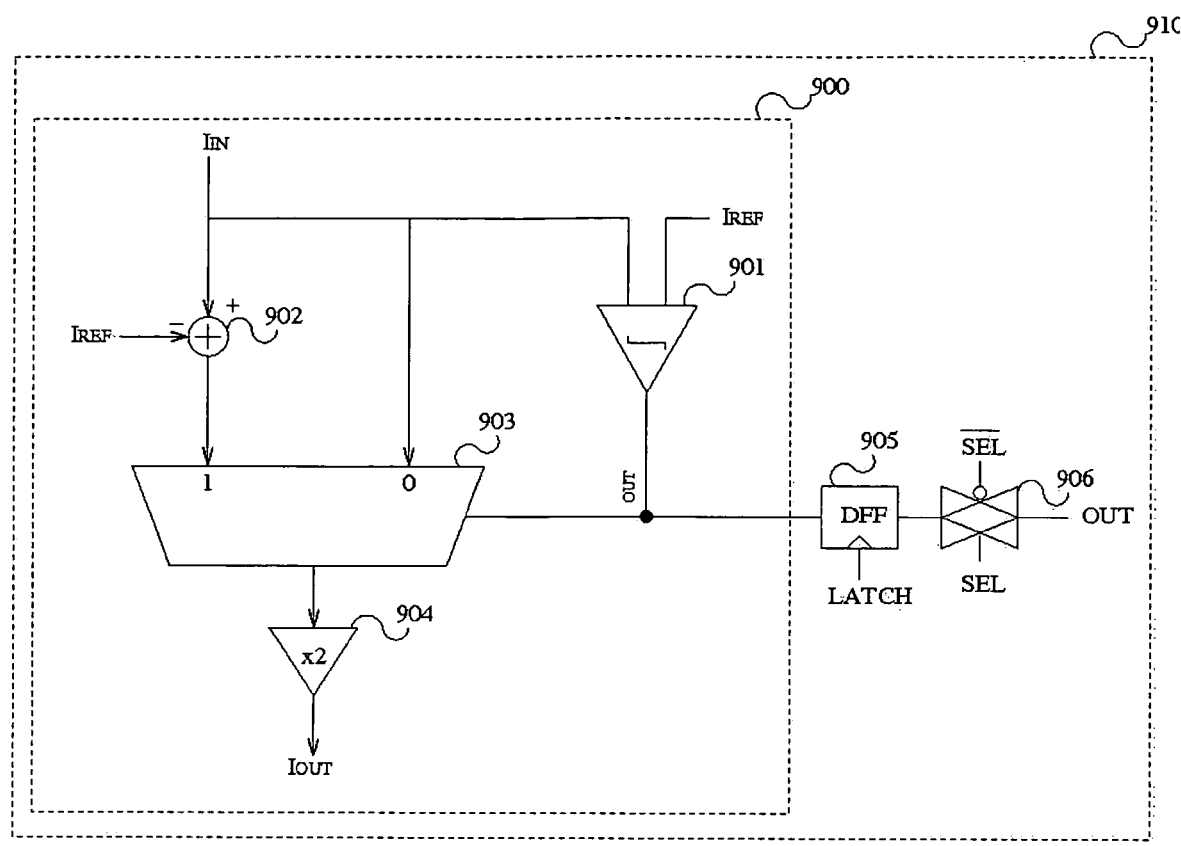
FIG. 9 shows a block diagram of a bit cell of an asynchronous current-mode cyclic comparison ADC with digital storage device according to an aspect of the invention.
Figure 10:
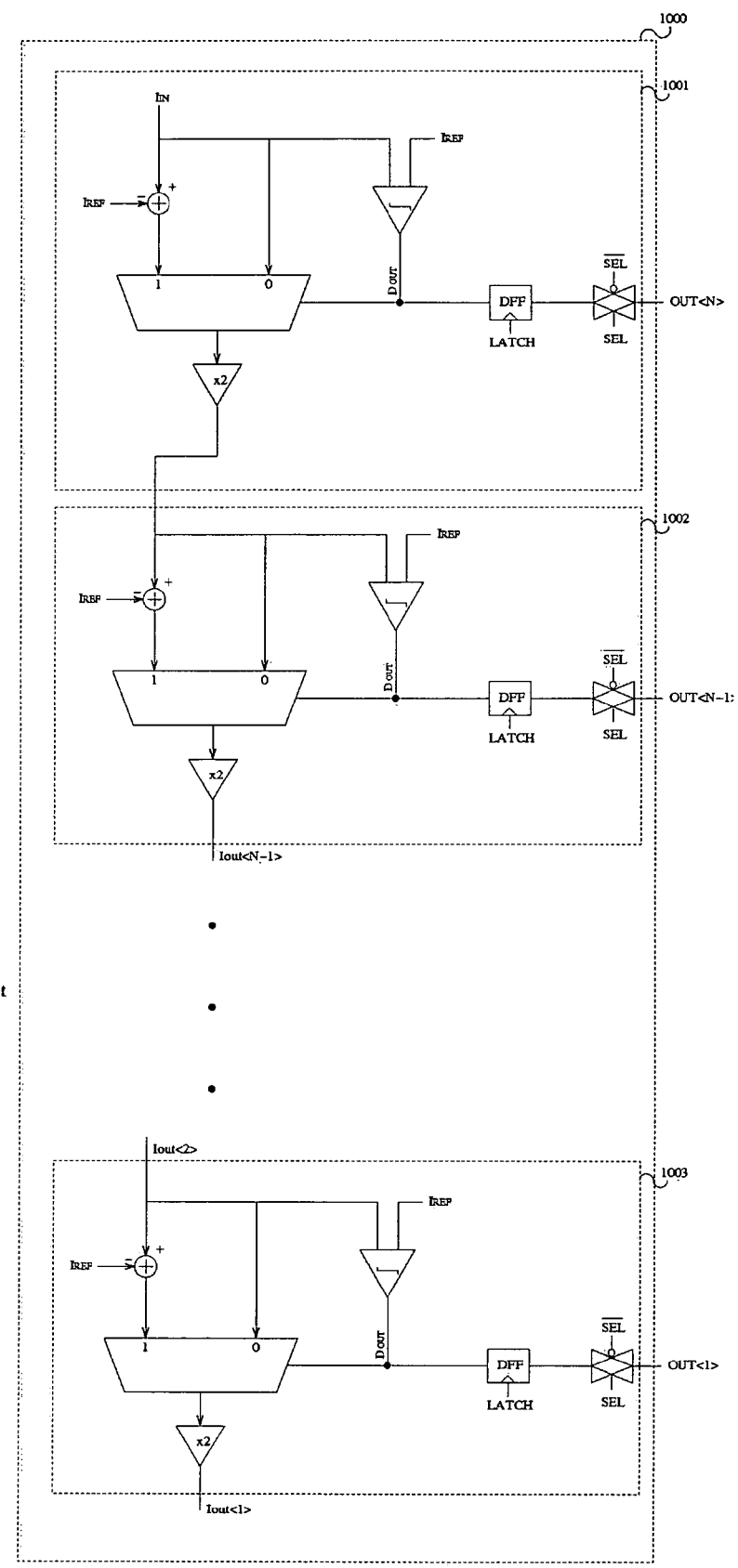
FIG. 10 shows a block diagram of the asynchronous current-mode cyclic comparison ADC with digital storage device according to an aspect of the invention.

In accordance with another aspect of the invention, an asynchronous current-mode cyclic comparison ADC circuit, that is free of digital storage devices, is disclosed. FIG. 5 shows the block diagram of an asynchronous current-mode cyclic comparison ADC circuit of this present invention. N-bit digital word can be obtained directly from the N outputs of the N current comparators in the N-bit asynchronous current-mode cyclic comparison ADC 500. No digital storage device is required, which can minimize the digital logic requirement of a finite state machine (FSM) when compared to that of the traditional successive-approximation ADC. This eliminates numerous crosstalks between the analog and digital components and significantly reduces the complexity of the system layout process. Digital storage devices can be added to the asynchronous current-mode cyclic comparison ADC 500 to make the ADC being compatible to common readout application. FIG. 9 shows the block diagram of a bit cell with digital storage device. Bit cell 910 comprises of a bit cell 900, D flip-flop 905 and transmission gate 906, where the structure of bit cell 900 is identical to that of bit cell 400. D flip-flop 905 acts as a digital storage device to store the digital value DOUT for readout. Control signal "LATCH" and "SEL" are used to control the storing time and the readout time respectively. FIG. 10 shows the N-bit asynchronous current-mode cyclic comparison ADC with digital storage devices. ADC 1000 comprises of N bit cells 910 with each bit cell corresponds to 1-bit conversion of the length-N digital word.

In accordance with another aspect of the invention an asynchronous current-mode cyclic comparison ADC circuit with controllable (or adjustable) power consumption is disclosed. The power consumption of the asynchronous current-mode cyclic comparison ADC circuit is directly proportional to the conversion dynamic range and the conversion resolution. The power consumption of the system can be controlled by adjusting the dynamic range of conversion.

Figure 8:
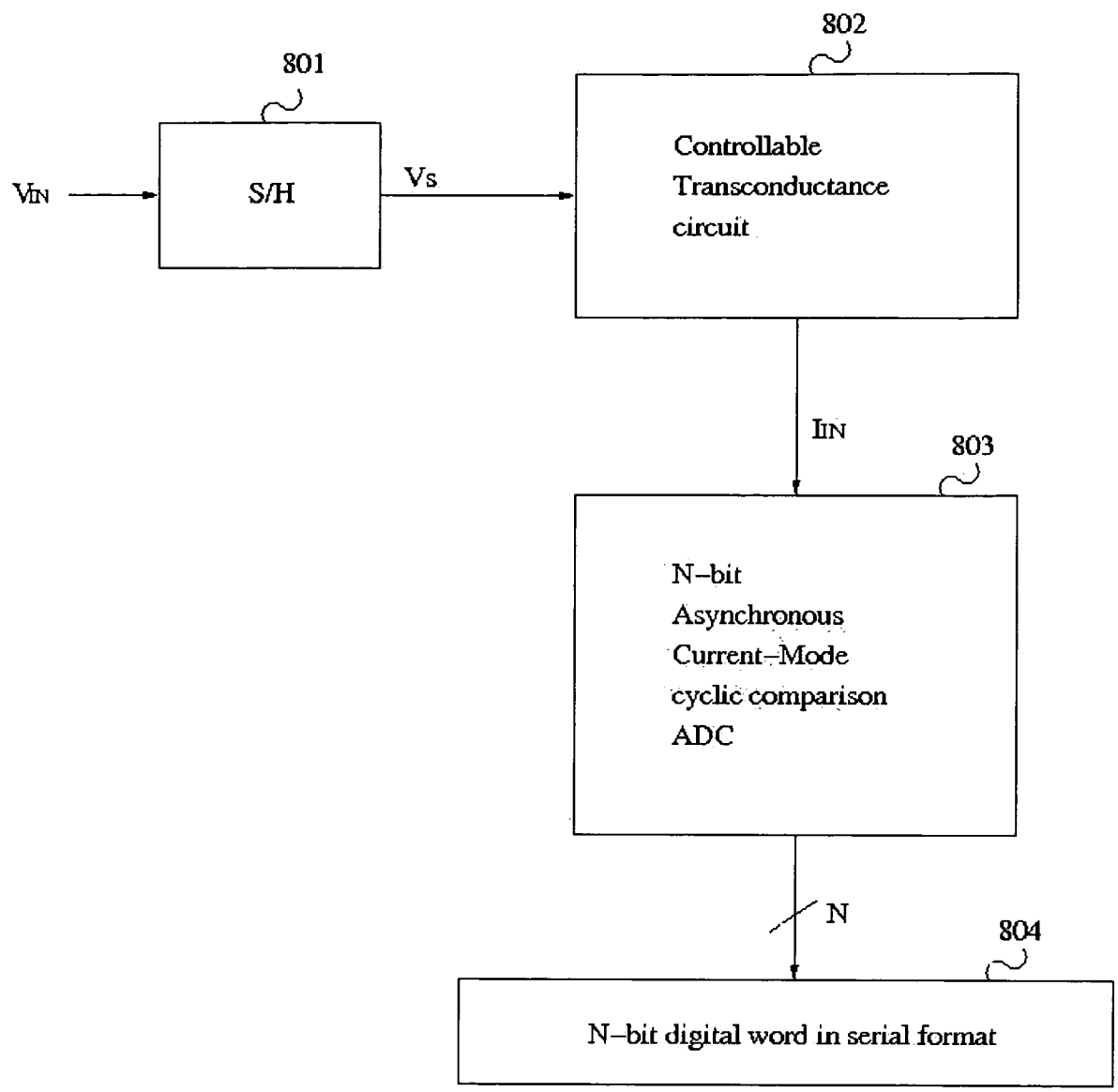
FIG. 8 shows a block diagram of analog-to-digital conversion for voltage input using asynchronous current-mode cyclic comparison ADC according to an aspect of the invention.

Furthermore, the illustrative embodiments of the invention are compatible with analog-to-digital conversion with analog input for both voltage and current mode operations. FIG. 8 shows a block diagram of an analog-to-digital conversion for analog input voltage using the asynchronous current-mode cyclic comparison ADC according to an aspect of the invention. The analog input voltage $V_{IN}$ is first sampled and held by a sample-and-hold (S/H) circuit 801 to give sampled and held analog input voltage $V_S$. The sampled and held analog input voltage $V_S$ is then passed to the controllable tranconductance circuit 802. The controllable tranconductance circuit 802 converts the sampled and held analog input voltage $V_S$ to analog input current $I_{IN}$ for the analog-to-digital conversion by the N-bit asynchronous current-mode cyclic comparison ADC 803 of the invention. Thus, the analog input voltage $V_{IN}$ can be converted to a desirable current range (i.e. $I_{IN}$ is confined in a desirable range which is controlled by the controllable tranconductance circuit 802). Thereafter, the power consumption of the system can be controlled.

In accordance with another aspect of the invention, an asynchronous current-mode cyclic comparison ADC circuit with compact silicon layout, is disclosed. The asynchronous current-mode cyclic comparison ADC circuit of the invention is free of discrete capacitors and resistors, thereby making the circuit in the illustrative embodiments independent of process variation and more compact in silicon layout. Moreover, the current subtraction circuit and current multiplication circuit, which play the important role in the invention, can be realized by using current mirrors. The use of current mirrors simplifies the circuitry of the invention as opamp free analog subtraction and multiplication blocks can be implemented. Opmap free analog subtraction and multiplication design using current mirrors enhances the power efficiency and reduces the requirement on silicon area. The compactness in silicon area is an advantage of the invention.

The asynchronous current-mode cyclic comparison ADC of the invention is extremely fast and power efficient. There are no switches and no timing control is required. The analog-to-digital conversion time is defined as the time required by the system to give a stable digital representation on the analog input signal. For synchronous ADCs, the analog-to-digital conversion time is O(N) clock cycles, where N is the length of the output digital word. Hence, the conversion time of synchronous ADCs increases with increasing resolution. This fact makes the synchronous ADCs less favorable in high speed and high resolution application. For the invention, the analog-to-digital conversion time depends on the longest conversion times among all bit cells.

The asynchronous current-mode cyclic comparison ADC 500 is free of digital storage device, such as D flip-flop, so that the digital logic requirement is minimal compared to the requirement of a finite state machine (FSM) in the traditional successive-approximation ADC structure. This eliminates the numerous crosstalks between the analog and digital components and significantly reduces the complexity of the system layout process. For applying the invention to common readout circuit, digital storage devices can be added.

FIG. 9 shows a block diagram of the asynchronous current-mode cyclic comparison ADC bit cell. The asynchronous current-mode cyclic comparison ADC bit cell 910 comprises of a bit cell 900, D flip-flop 905 and transmission gate 906, where the structure of bit cell 900 is identical to that of bit cell 400. D flip-flop 905 acts as digital storage device to store the digital value of DOUT for readout. Control signal "LATCH" and "SEL" are used to control the storing time and the readout time respectively.

There are four input terminals and two output terminals of the bit cell 910. The first input terminal is for the analog input signal $I_{IN}$. The second input terminal is for the reference signal $I_{REF}$. The third input terminal is for digital control signal "LATCH". The forth input terminal is for digital control signal "SEL". The first output terminal is for the 1-bit digital output of the analog-to-digital conversion result DOUT. The second output terminal is for the analog output current $I_{OUT}$, which is the analog signal passed to subsequent bit cell. The value of $I_{OUT}$ is either $2\times(I_{IN}-I_{REF})$ or $2\times I_{IN}$ depends on the digital signal DOUT. When DOUT="0", $I_{OUT}$ equals $2\times I_{IN}$ and when DOUT="1", $I_{OUT}$ equals $2\times(I_{IN}-I_{REF})$.

The operation of bit cell 910 is similar to that of bit cell 400 and it can also be illustrated by FIG. 7. If the amplitude of the analog input signal $I_{IN}$ is smaller than that of the reference signal $I_{REF}$, the amplitude of the original analog input signal $I_{IN}$ is doubled. If the amplitude analog input signal $I_{IN}$ is greater than or equals to that of the reference signal $I_{REF}$, the analog input signal $I_{IN}$ is first subtracted by the reference signal $I_{REF}$, then the difference signal $I_{IN}-I_{REF}$ is doubled in amplitude. Thereafter, the analog output signal $I_{OUT}$ of the bit cell 910 is obtained. The analog output signal $I_{OUT}$ of bit cell 910 is then passed to the subsequent bit cell. The analog input signal $I_{IN}$ of subsequent stage equals to $2\times I_{IN}$ when previous stage DOUT="0" and $I_{IN}$ of subsequent stage equals to $2\times(I_{IN}-I_{REF})$ when previous stage DOUT="1". The value of DOUT is then latched into a storage element, which can be implemented by D flip-flop 905 for readout. The digital output of the current comparator 901 (i.e. DOUT) is coupled to the analog multiplexer 903 and also the D input of the D flip-flop 905. Control signal "LATCH" is coupled to the CLOCK input of the D flip-flop 905. The current comparator 901 digital output DOUT is latched into the D flip-flop 905 when control signal "LATCH" toggles from "0" to "1". The digital value stored in D flip-flop 905 corresponds to the conversion result of the bit cell 910. The Q output of the D flip-flop 905 is coupled to the transmission gate 906. Control signal "SEL" is coupled to the transmission gate 906. When control signal "SEL" is in "1", the digital value stored in D flip-flop 905 is then available at the second output terminal of the bit cell 910 (i.e. OUT is available).

FIG. 10 shows the N-bit asynchronous current-mode cyclic comparison ADC with digital storage devices. ADC 1000 comprises of N bit cells 910 with each bit cell corresponds to 1-bit conversion of the length-N digital word OUT<N: 1>. The number of bit cells N can be varied and it is corresponding to the number of bits of the digital output. Bit cell 1001 corresponds to the most significant bit (MSB) conversion of the analog input signal $I_{IN}$. Bit cell 1002 corresponds to the second most significant bit conversion of the analog input signal $I_{IN}$. Bit cell 1003 corresponds to the least significant bit (LSB) conversion of the analog input signal $I_{IN}$. The first input terminal of bit cell 1001 is coupled to the external analog input signal $I_{IN}$. The second input terminal of the bit cell 1001 is coupled to the reference signal $I_{REF}$. The first output terminal of the bit cell 1001 is coupled to the first input terminal of bit cell 1002. The second output terminal of the bit cell 1002 is coupled to the first input terminal of the subsequent bit cell. The rest of the (N−3) bit cells are connected in cascading manner with the first output terminal of each bit cell coupled to the first input terminal of the subsequent bit cell and the second input terminals of each bit cells coupled to the reference signal $I_{REF}$. Analog-to-digital conversion starts at the MSB bit cell 1001. The analog input current $I_{IN}$ sourced will undergo MSB conversion by bit cell 1001. The analog input current $I_{IN}$ is compared to the reference signal $I_{REF}$ by the current comparator in bit cell 1001 and generates conversion output DOUT. When $I_{IN}$Error! Objects cannot be created from editing field codes. $I_{REF}$, DOUT="1" and $I_{OUT}=2\times(I_{IN}-I_{REF})$. When $I_{IN}<I_{REF}$, DOUT="0" and $I_{OUT}=2\times I_{IN}$. Hence MSB is determined. The analog output signal $I_{OUT}$ is passed to subsequent bit cell 1002 for the second MSB conversion. Each bit cell undergoes the same operation performed by bit cell 1001. N-bit conversion is completed when bit cell 1003 digital output DOUT (i.e. the LSB of length-N digital word) is ready.

Control signal "LATCH" and "SEL" are required to store the conversion result and readout respectively. These two signals are not related to analog-to-digital conversion. They are aimed to apply the invention to common readout circuits. The analog-to-digital conversion time is defined as the time required by the system to give a stable digital representation on the analog input signal. For synchronous ADCs, the analog-to-digital conversion time is O(N) clock cycles, where N is the length of the output digital word. Hence, the conversion time of synchronous ADCs increases with increasing resolution. This is the fact that makes the synchronous ADCs being less favorable in high speed and high resolution applications. For the invention, the analog-to-digital conversion time depends on the longest conversion times among all bit cells. All digital output DOUTs could be latched into individual D flip-flop in each bit cell simultaneously with the control of signal "LATCH" toggles from "0" to "1". The conversion result OUT<N: 1> is read out when "SEL" is in "1".

The design of the asynchronous current-mode cyclic comparison ADC of the invention is very flexible. The resolution of the ADC can be increased or decreased by adding additional bit cells or removing redundant bit cells. The bit cell 400 and bit cell 910 of the invention can also be applied to analog-to-digital converter with one bit cell or pipelined analog-to-digital converter. One advantage of the invention is its bit cell structure. Each bit cell is independent from the others. The digital result of each block is independent from the digital output of the preceding bit cells. The N-bit asynchronous current-mode cyclic comparison ADC comprises N identical bit cells connected serially. Each bit cell acts as a 1-bit current mode ADC and corresponds to the conversion of one bit of the length-N digital word. Identical current comparator is used for every single bit of conversion and hence achieves consistent conversion accuracy across all digits.

Thus, the illustrative embodiments of the invention provide an asynchronous current-mode cyclic comparison ADC circuit that can achieve high resolution, high speed, low power consumption and capacitor- and resistor-free circuits. They further provide an asynchronous current-mode cyclic comparison ADC circuit that is flexible in adjusting the dynamic range of the conversion. Common current reference $I_{REF}$ applied on each bit cell avoids the problem of multi-threshold variation. The conversion accuracy is consistent across all digits in the embodiments. The embodiments also provide an asynchronous current-mode cyclic comparison ADC circuit that is free of storage devices. The power consumption of the asynchronous current-mode cyclic comparison ADC circuits is also controllable and adjustable in one aspect of the invention. Additionally, the asynchronous current-mode cyclic comparison ADC circuits in the illustrative embodiment are compact in silicon area due to the lack of capacitors and resistors, which also result in a circuit that is less sensitive to process variations.

Although the preferred embodiments of the inventions have been disclosed, with various components connected to other components, persons skilled in the art will appreciate that it may not be necessary for such connections to be direct and additional components may be interconnected between the shown components without departing from other spirit of the invention as shown. For examples, The enumerated digital value "0" or "1" can be interchanged;

the D flip-flop can be negative edge triggered instead of positive edge triggered as described above; and the connections of "SEL" and "$\overline{SEL}$" signals to transmission gate can be interchanged; and D flip-flop can be replaced with other storage element devices, including dynamic memory cell, and transmission gate can be replaced with other bus connection devices that can achieve similar functions.

One skilled in the art will appreciate that the invention can be practiced by other than the described embodiments, which are presented for purposes of illustration and not of limitation, and the invention is limited only by the claims which follow.

The invention claimed is:

1. An analog-to-digital converter (ADC) for generating a digital representation of an analog input signal, the ADC comprising a plurality of sub-ADCs cascading from a first stage to a last stage, each sub-ADC comprising a current comparator, having an analog current input adapted to receive an analog current signal, a reference current input adapted to receive a reference current signal, and an output configured to be a digital output of the sub-ADC;

a subtractor, having a first input operatively coupled to the analog current signal, a second input operatively coupled to the reference current signal, and an output;

an analog multiplexer, having a first input operatively coupled to the output of the subtractor, a second input operatively coupled to the analog current signal, a selector input operatively coupled to the output of the current comparator, and an output configured for analog current output generation of the sub-ADC;

wherein the analog current signal at each sub-ADC except for the sub-ADC disposed at the first stage, is operatively coupled to the analog current output of an immediately preceding stage sub-ADC; and the plurality of sub-ADCs are configured to operate without synchronization with each other.

2. The ADC of claim 1, wherein at least one of the sub-ADCs is a one-bit ADC.

3. The ADC of claim 1, being free of digital storage device.

4. The ADC of claim 1, wherein the reference current inputs of the current comparators are operatively coupled to each other.

5. The ADC of claim 4, having an adjustable dynamic range.

6. The ADC of claim 5, wherein the dynamic range is dependent on the amplitude of the reference current signal.

7. The ADC of claim 1, being free of discrete capacitors or resistors.

8. The ADC of claim 1, wherein at each stage the analog multiplexer and the current comparator being configured to generate at the output of the analog multiplexer a signal indicative of a signal at the first input of the analog multiplexer when the analog current signal is greater than the reference current signal, and generate at the output of the analog multiplexer a signal indicative of a signal at the second input of the analog multiplexer when the analog current signal is smaller than the reference current signal.

9. The ADC of claim 1, further comprising a current multiplier operatively coupled to the output of the analog multiplexer and configured to generate at the output of the sub-ADC a current signal with an amplitude that is a predetermined factor times the amplitude of current signal at the output of the analog multiplexer.

10. The ADC of claim 1, when the analog input signal is a voltage signal, the ADC further comprising a circuit module which is configure to convert the voltage signal to current signal.

11. A one-bit ADC, comprising:

a current comparator, having an analog current input adapted to receive an analog current signal, a reference current input adapted to receive a reference current signal, and an output configured to be a digital output of the ADC;

a subtractor, having a first input operatively coupled to the analog current signal, a second input operatively coupled to the reference current signal, and an output; and an analog multiplexer, having a first input operatively coupled to the output of the subtractor, a second input operatively coupled to the analog current signal, a selector input operatively coupled to the output of the current comparator, and an output configured for analog output generation of the ADC.

12. The ADC of claim 11, further comprising a current multiplier operatively coupled to the multiplexer and configured to multiply the signal generated by the multiplexer by a predetermined factor.

13. A method, comprising generating an N-bit digital representation of the amplitude of an analog input signal, in a plurality of stages, stage comprises:

comparing, by a current comparator, amplitude of an analog current signal with amplitude of a reference current signal;

generating, by the current comparator, a subset of the N-bit digital representation based at least on result of the comparing; and controlling, by the current comparator, a multiplexer to selectively generate a analog output current with the amplitude indicative of either the analog current signal or the difference between the amplitudes of the analog current signal and the reference current signal, based at least on the generated subset of the N-bit digital representation;

wherein the analog current signal is operatively coupled to the analog output current from an immediate preceding stage, except for the first stage.

14. The method of claim 13, wherein the reference current signal is the same for the comparing at each stage.

15. The method of claim 13, wherein generating a subset of the N-bit digital representation comprises generating one bit of the N-bit representation.

16. The method of claim 13, further comprising adjusting the amplitude of the reference current signal to change the maximum amplitude of the analog input signal that can be represented by the N-bit representation.

* * * * *